United States Patent
Bronner et al.

(10) Patent No.: US 6,767,789 B1
(45) Date of Patent: Jul. 27, 2004

(54) METHOD FOR INTERCONNECTION BETWEEN TRANSFER DEVICES AND STORAGE CAPACITORS IN MEMORY CELLS AND DEVICE FORMED THEREBY

(75) Inventors: Gary B. Bronner, Stormville, NY (US); David V. Horak, Essex Junction, VT (US); Toshiharu Furukawa, Essex Junction, VT (US); Jack A Mandelman, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/105,739

(22) Filed: Jun. 26, 1998

(51) Int. Cl.[7] .................. H01L 31/119; H01L 21/00; H01L 21/8242; H01L 21/8236
(52) U.S. Cl. .................. 438/254; 438/256; 257/306; 257/307; 257/308; 29/25; 29/30; 29/42
(58) Field of Search .................. 257/306, 307, 257/308; 271/25–42; 438/3, 254, 256

(56) References Cited

U.S. PATENT DOCUMENTS

| | | | |
|---|---|---|---|
| 4,219,834 A | * | 8/1980 | Esch et al. .................. 357/41 |
| 4,240,845 A | * | 12/1980 | Esch et al. .................. 148/1.5 |
| 5,053,351 A | | 10/1991 | Fazan et al. |
| 5,146,291 A | | 9/1992 | Watabe et al. |
| 5,291,053 A | | 3/1994 | Pfiester et al. |
| 5,633,781 A | | 5/1997 | Saenger et al. |
| 5,670,806 A | | 9/1997 | Jun |

OTHER PUBLICATIONS

"The Evolution of IBM CMOS DRAM Technology" by Adler et al., IBM J. Res. Develop., vol. 39 No. 1/2 Jan./Mar. 1995, pp. 167–188.
"A 0.6 $\mu m^2$ 256Mb Trench DRAM Cell With Self–Aligned BuriEd Strap (BEST)", by Nesbit et al., IEDM 93–627, pp. 26.2.1–26.2.4.

* cited by examiner

Primary Examiner—Long Pham
Assistant Examiner—Shrinivas H. Rao
(74) Attorney, Agent, or Firm—Schmeiser, Olsen & Watts; William D. Sabo

(57) ABSTRACT

The preferred embodiment of the present invention provides unique structure for connecting between a storage capacitor and a transfer device in a memory cell and a method for fabricating the same. The preferred embodiment of the present invention forms a capacitor structure having a "lip" at its top on the side the connection is to be made. To form the connection, dopant is diffused from the lower surface of the capacitor step and into the substrate, forming a surface strap to connect between the storage capacitor and the transfer device. This surface strap has the advantage of being self aligned with the storage capacitor and the transfer device, facilitating higher memory cell densities. The present invention can be used to form connections between storage capacitors and memory cells in a wide variety of devices.

29 Claims, 22 Drawing Sheets

METHOD FOR INTERCONNECTION BETWEEN TRANSFER DEVICES AND STORAGE CAPACITORS IN MEMORY CELLS AND DEVICE FORMED THEREBY

BACKGROUND OF THE INVENTION

1. Technical Field

The present invention relates generally to the field of semi-conductor manufacturing and, more specifically, to a method for forming interconnections in memory cells.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in Dynamic Random Access Memory (DRAM) markets. Each DRAM cell consists of a transfer device, typically a MOS transistor, and a storage capacitor. Two types of storage capacitors are commonly used today, stack capacitors and trench capacitors. Trench capacitors increase capacitance by extending into the storage node deeply into the substrate. One particular area of concern in trench capacitor DRAM technology is the connection between the trench storage capacitor and the transfer device.

Several different methods and structures have been used to provide connection between the transfer device and the trench storage capacitor. These structures have been generically referred to as "straps".

One method for forming straps involves selectively growing silicon between the capacitor and the transfer device after the spacers on the gate conductor have been formed and the junctions implanted. Following this, salicide is formed, consuming the selective silicon to form a low resistance strap. This process has the advantage of not requiring extra mask steps for the strap, but it has the disadvantage of increasing word pitch because the passing word line cannot pass over the strap contact.

Another method for forming straps involves photolithographic definition of an area to form the strap. In this method, after source-drain implantation, a thin layer of silicon nitride is deposited on the chip. A contact hole is defined photolithographically in the strap area as the trench top oxide is etched in each cell, exposing the doped trench polysilicon and the source-drain diffusion that are to be connected. A blanket layer of intrinsic polysilicon is then deposited, and the wafer is annealed to diffuse dopant up into the intrinsic polysilicon from the trench and diffusion tops. The result is a doped polysilicon layer bridging the trench and the source-drain diffusion. The remaining intrinsic polysilicon is then removed by a selective wet etch, isolating the cells from one another. One disadvantage of this process is that the selectivity of the wet etch must be carefully controlled. In particular, the wet etch must remove undoped polysilicon to avoid strap to strap shorts, while the doped polysilicon must remain. Another disadvantage is that the strap is not self aligned to the trench and thus tight photolithographic alignment control is required to assure connection between the trench and the source-drain diffusion.

Another method for connecting the storage capacitor to the transfer devices uses a "buried strap". Buried straps are formed using outdiffusion from the sidewall of the storage capacitor in the silicon substrate. In particular, the portion of the oxide collar in the trench capacitor where the buried strap is to be formed is removed. Polysilicon is then blanket deposited in the place of the removed oxide collar. The wafer is then annealed, causing the dopant to outdiffuse from inside the trench capacitor and into the buried strap region. Thus, outdiffusion of the dopant from the storage capacitor polysilicon merges with the source-drain diffusion to complete the contact between the transfer device and the storage capacitor. To minimize the buried strap diffusion from affecting device characteristics, arsenic, which diffuses slowly is preferred as the n+type dopant in the trench polysilicon for the n-channel transfer device.

Turning now to FIG. 22, a prior art merged isolation and node trench (MINT) DRAM cell using a buried strap is illustrated schematically. The cell includes a substrate 10 with a p-type well 12 formed at its top portion. At the upper surface of the p-type well 12 a transfer device 14 is formed that includes a control gate 16 that is responsive to a word access line of the DRAM array support circuits, not shown. Also at the upper surface is a passing word line 17, used to access adjacent devices not shown. The transfer device 14 couples data between bit line diffused $n^+$ region 18 and diffused $n^+$ region 20 through the channel region formed in p-type well 12. A shallow trench isolation region 30 serves to isolate this device from adjacent devices not shown. A deep trench 22 is formed into the substrate 10, with deep trench 22 adjacent to $n^+$ region 20. A buried $n^+$ plate 25 is diffused from the deep trench walls from a deposited and recessed arsenic doped glass. Inside deep trench 22 is formed the capacitor storage node comprising $n^+$ type polysilicon electrode 24. The buried plate 25 is separated from the polysilicon electrode 24 by a thin dielectric layer. At the top of the storage trench 22 is a thick isolating collar 28 which serves to prevent parasitic vertical device leakage. A portion of the thick isolating collar 28 is removed to allow $n^+$ region 20 and the polysilicon storage node 24 to be connected by a buried strap 11. Again, this buried strap 11 is formed by removing a portion of the isolating collar 28 between the polysilicon electrode 24 and the $n^+$ region 20. The cell is then annealed, causing $n^+$ dopant to diffuse from the polysilicon electrode 24 and into the adjacent substrate, forming buried strap 11.

One problem with buried straps is that the method which forms the buried strap results in a buried strap which is deeper than the optimum depth of the $n^+$ diffusion of the transfer device. The deeper buried strap degrades the sub threshold leakage of the adjacent transfer device. This results in unwanted loss of stored charge and shortening of the retention time. Therefore, to avoid the sub-threshold leakage problem, either the gate length must be designed longer than the minimum dimension, or the distance between the gate and the strap must be designed large enough to keep the buried strap away from the device. Either of these solutions makes it almost impossible to effectively reduce the size of the DRAM cell.

Thus, without an improved method and structure for connecting between storage capacitors and transfer devices, the density of memory devices will be limited.

DISCLOSURE OF INVENTION

Accordingly, the present invention provides unique structure for connecting between a storage capacitor and a transfer device in a memory cell and a method for fabricating the same. The preferred embodiment of the present invention forms a capacitor structure having a "lip" at its top on the side the connection is to be made. To form the connection, dopant is diffused from the lower surface of the capacitor step and into the substrate, forming a surface strap to connect between the storage capacitor and the transfer device. This surface strap has the advantage of being self aligned with the storage capacitor and the transfer device, facilitating higher memory cell densities. The present invention can be used to form connections between storage capacitors and memory cells in a wide variety of devices.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

The preferred embodiment of the present invention provides unique structure for connecting between a storage capacitor and a transfer device in a memory cell and a method for fabricating the same. The preferred embodiment of the present invention forms capacitor structure having a "lip" at its top on the side the connection is to be made. To form the connection, dopant is diffused from the lower surface of the capacitor lip and into the substrate, forming a surface strap to connect between the storage capacitor and the transfer device. This surface strap has the advantage of being self aligned with the storage capacitor and the transfer device, facilitating higher memory cell densities. The present invention can be used to form connections between storage capacitors and memory cells in a wide variety of devices.

Figure 1:
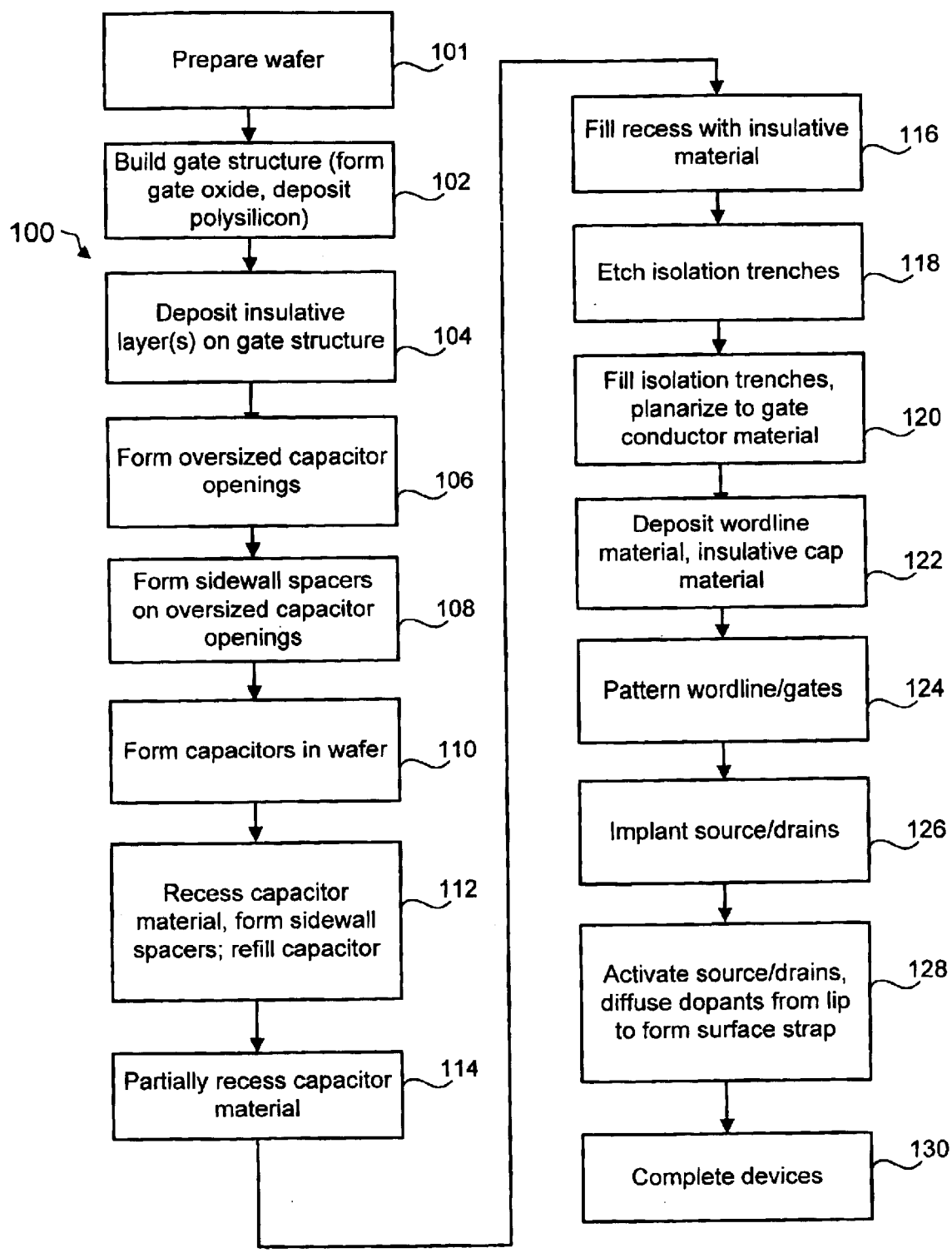
FIG. 1 is a flow diagram illustrating a preferred method in accordance with the present invention.

Turning now to FIG. 1, a method 100 for forming a memory cell in accordance with the preferred embodiment is illustrated. The first step 101 is to prepare the wafer. This typically involves providing a p-type, single crystal silicon wafer, followed by a sacrificial oxide growth to remove surface defects. Additionally, before the sacrificial oxide is stripped, well and threshold tailoring implants can be made.

The next step 102 is to build the gate stack. This preferably involves forming the gate dielectric, and depositing the gate conductor on top of the gate dielectric. For example, a thin layer of silicon dioxide can be grown on the wafer to provide the gate dielectric, and a layer of $n^+$ doped polysilicon deposited on the gate dielectric to provide the gate conductor.

The next step 104 in the preferred embodiment is to deposit additional layer(s) of insulator material on the gate conductor material. These layers preferably comprise a nitride film on the gate polysilicon covered by a layer of silicon dioxide or boron doped silica glass (BSG).

Figure 2:
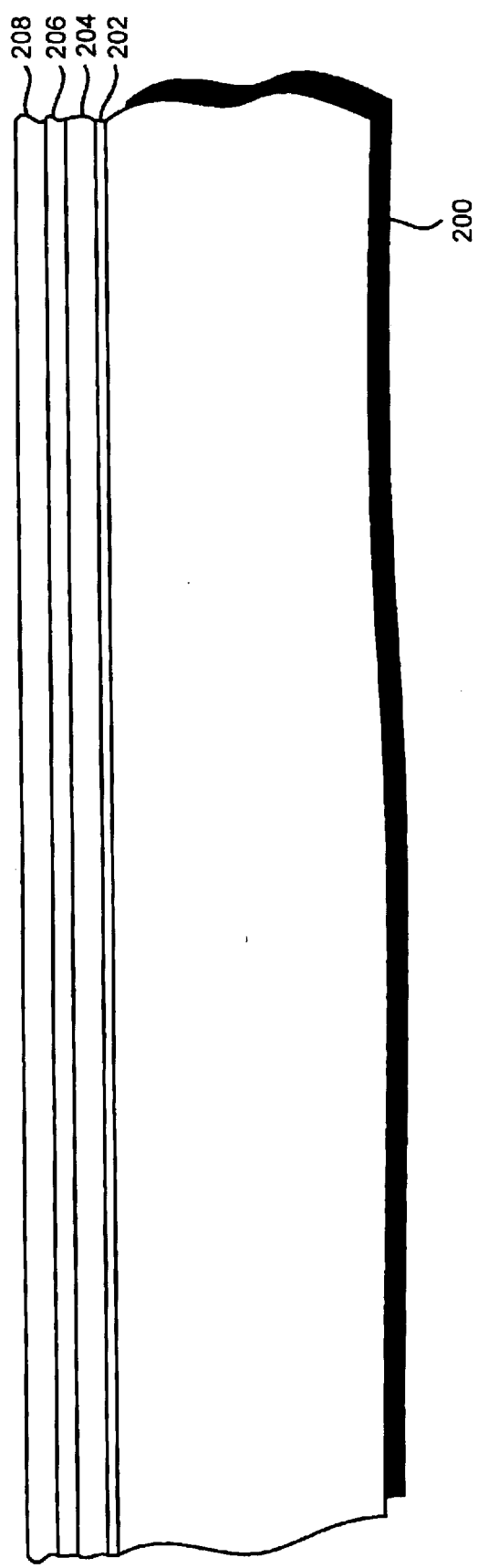
FIGS. 2–13 are schematic cross sections illustrating a first embodiment of the present invention.

Turning now to FIG. 2, a wafer portion 200 is illustrated having a gate oxide layer 202, a gate conductor layer 204, a nitride layer 206 and a silicon dioxide or BSG layer 208 formed on its top surface. In the preferred embodiment, the gate oxide layer 202 has a thickness of approximately 7 nm, the gate conductor layer 204 has a thickness of approximately 100 nm. Additionally in the preferred embodiment, a silicon nitride layer 206 of approximately 200 nm is deposited on the gate polysilicon, followed by approximately 700 nm of chemical vapor deposited silicon dioxide or BSG 208.

Returning to the method 100 illustrated in FIG. 1, the next step 106 is to form oversized capacitor openings in the gate structure materials and the insulator layers. In the preferred embodiment, these oversized capacitor openings are slightly larger than the desired size of the final trench capacitor opening. For example, the oversized capacitor openings can be 0.25F larger than desired size of the final trench capacitor, where F is the minimum feature size for the lithography system being used to fabricate the trench capacitor opening.

The next step 108 in method 100 is to form sidewall spacers on the sidewalls of the oversized capacitor openings. These sidewall spacers are used as a mask to define the actual dimension of the trench capacitors. These sidewall spacers are preferably formed by conformally depositing a dielectric, such as silicon dioxide over wafer, and then directionally etching the dielectric until it is removed from the horizontal surfaces (such as the portion of the wafer exposed through the oversized capacitor openings). In the preferred embodiment, the sidewall spacers have a width of approximately 0.25F.

Figure 3:
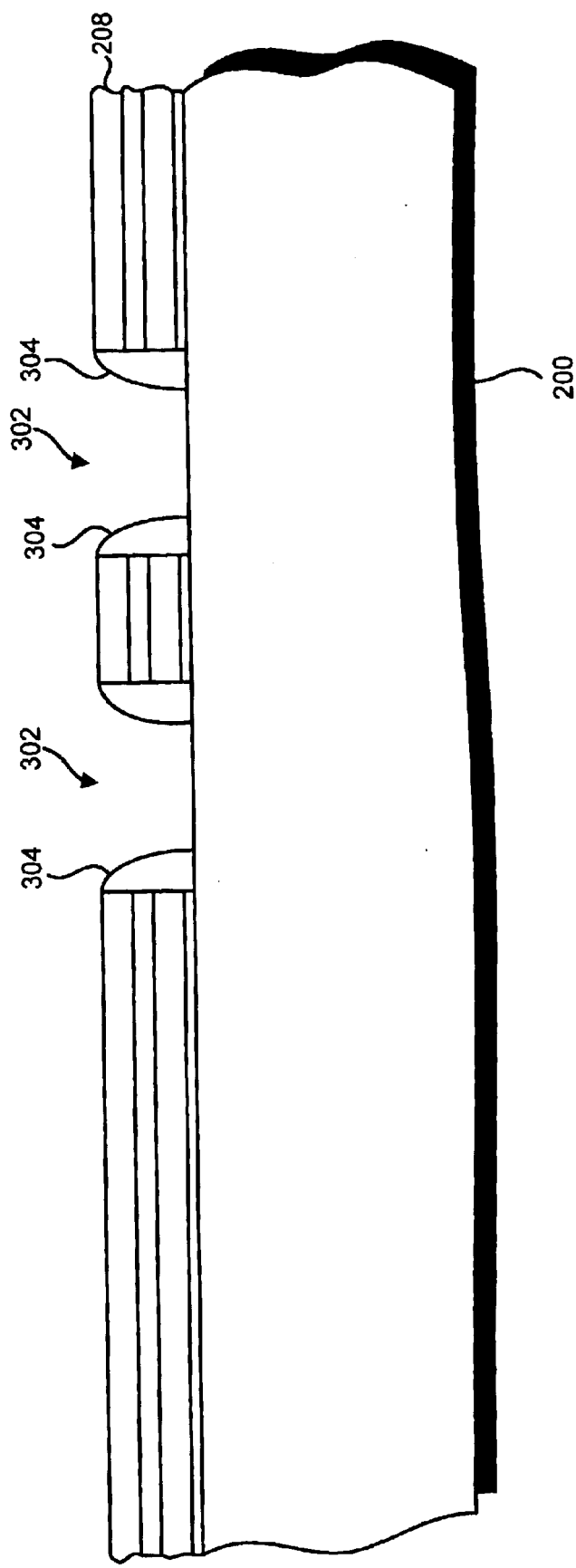

Turning now to FIG. 3, the wafer portion 200 is illustrated with oversized capacitor openings 302 formed in the gate structure, and sidewall spacers 304 formed on the sidewalls of the oversized capacitor openings.

Figure 4:
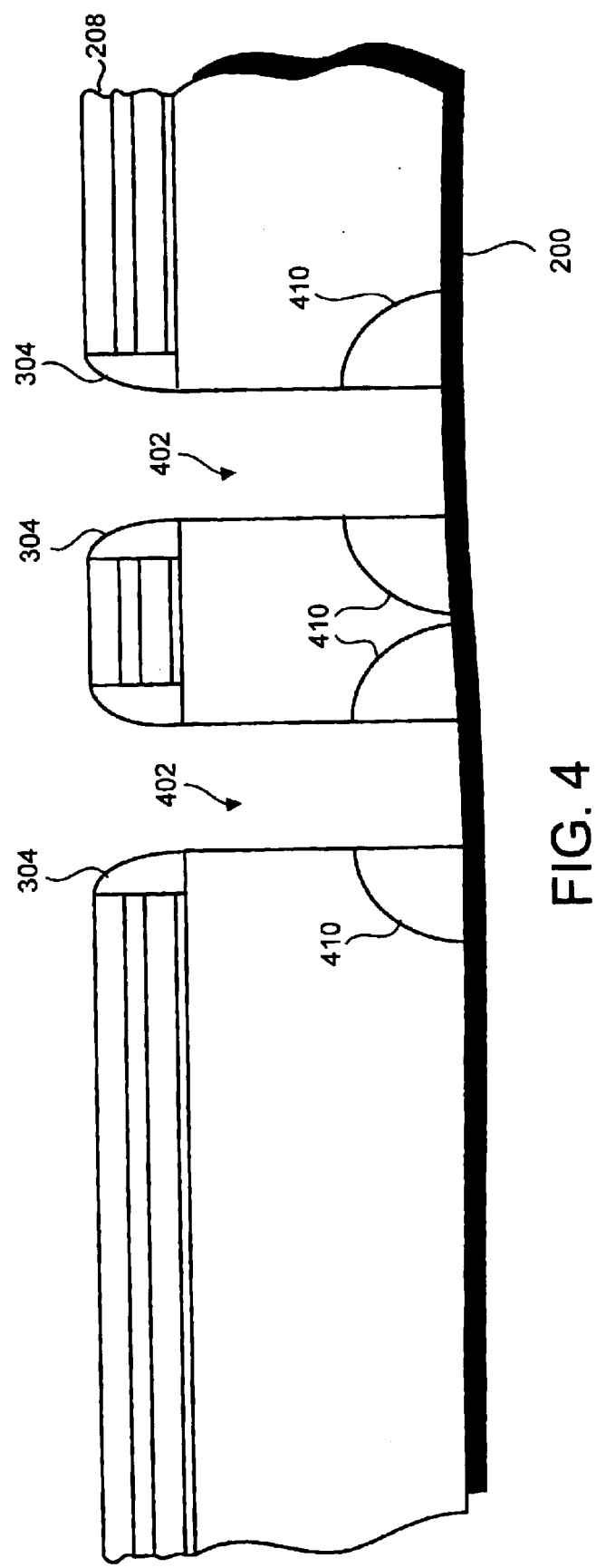

The next step 110 is to form the capacitors in the wafer. This involves etching capacitor trenches, forming the capacitor dielectric and filling the capacitor trench with conductive material. Other processing at this time can include buried plate formation. In the preferred embodiment, the capacitor trenches are etched approximately 8 µm deep using the top insulator layer and the sidewall spacers as a mask to define their dimensions. This step is preferably done using any etch process that is selective to the insulator layer and the sidewall spacer material. Turning now to FIG. 4, the wafer portion 200 is illustrated after capacitor trenches 402 have been formed using oxide layer 208 and sidewall spacers 304 as a mask to define their dimension. Additionally, buried plates 410 have been formed by depositing n-type doped glass into the trenches, recessing the doped glass, outdiffusing n-type dopant from the doped glass into the substrate, and stripping off the remaining doped glass. These buried plates 410 comprise the counter electrode of the capacitor.

With the capacitor trenches etched, capacitor dielectric, such as a thin layers of silicon nitride and/or silicon dioxide are formed on the walls of the capacitor trenches. In the preferred embodiment, the capacitor trenches are then filled with conductive material, herein generically referred to as capacitor fill material. In the preferred embodiment, the capacitor fill material comprises $n^+$ polysilicon, but could also comprise other materials. After the capacitor fill material is deposited it is planarized to create an even surface with remaining insulator layer and remove the capacitor fill material from other portions of the wafer.

The next step 112 is to recess the capacitor fill material, and form sidewall spacers on the exposed portion of the capacitor trench in the wafer and the capacitor openings in the gate structure, and refill the capacitor trench. In the preferred embodiment, where the capacitor fill material comprises n+ polysilicon, the fill material can be recessed using an isotropic etch process such as plasma etching. The sidewall spacers of approximately 0.1F width are then formed by conformally depositing insulator material such as silicon dioxide, and then directionally etching the insulator material until it is removed from the horizontal surfaces. With the sidewall spacers formed, the capacitor trench in the wafer and the oversized capacitor opening in the gate structure are refilled with n+ polysilicon and planarized to the nitride surface. The sidewall spacers formed on the upper portion of the capacitor trench in the wafer comprises insulator collars which are used to suppress parasitic device leakage between the n+ diffusion and the n+ buried plate. In the most preferred embodiment, care should be taken to avoid over etching the insulator collars to avoid opening a contact between the sidewall of the capacitor and the adjacent substrate. Some over etching is allowable, but it is generally preferred to keep the sidewall of the capacitor from contacting the adjacent substrate any deeper than one half the depth of the adjacent source/drain of the transfer device.

Figure 5:
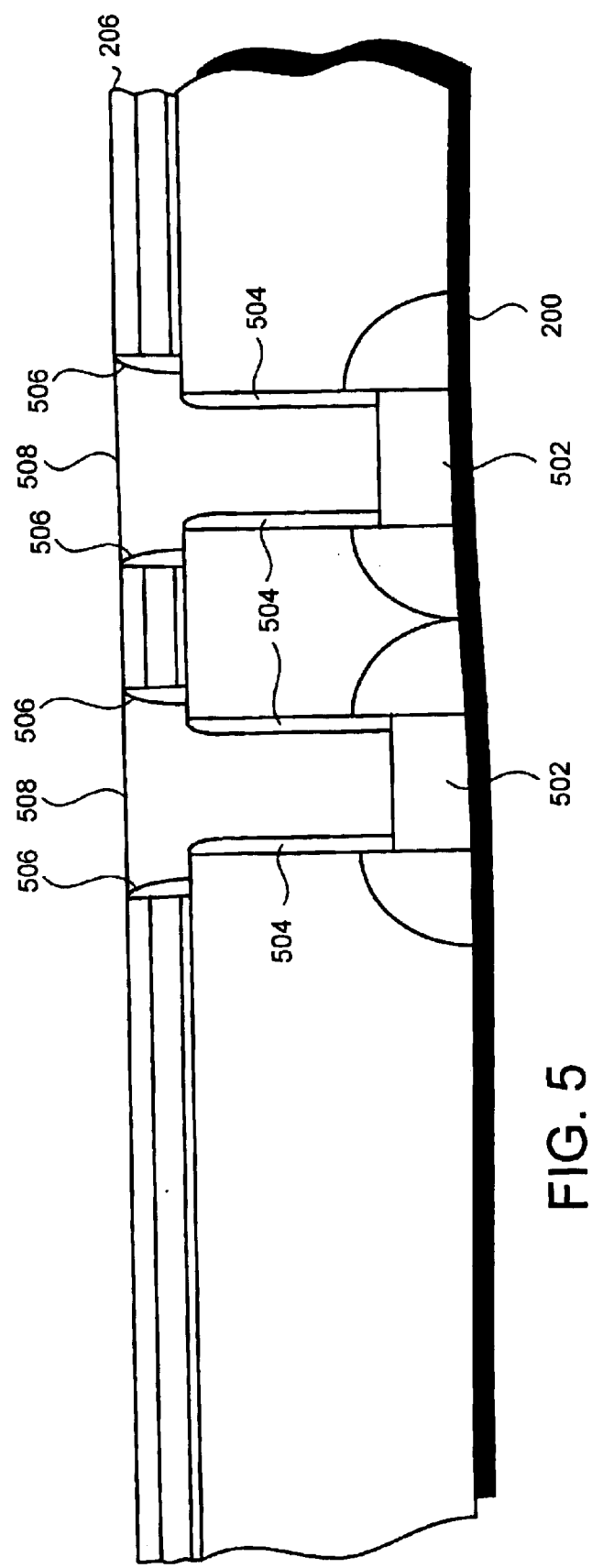

Turning now to FIG. 5, the wafer portion 200 is illustrated after the capacitor trench has been filled with polysilicon 502, recessed, sidewall spacers 504 formed on the sidewalls of the exposed capacitor trenches, sidewall spacers 506 formed on the sidewall of the oversized capacitor openings, and the capacitor trench and oversized capacitor openings refilled with polysilicon 508, and planarized again to the nitride layer 206. In the preferred embodiment, the polysilicon 508 will be used to form the surface strap, and has a dopant level of approximately $5 \times 10^{19}$ to $5 \times 10^{21}$ atoms/cm$^3$.

Figure 6:
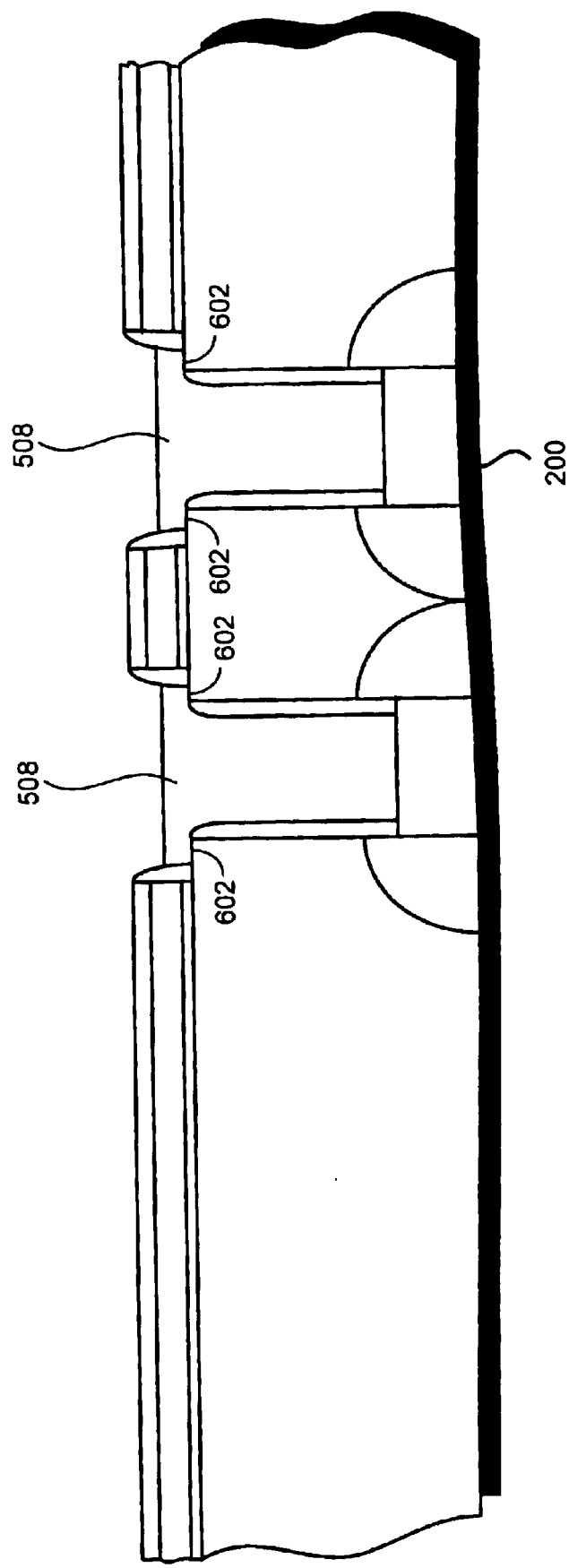

The next step 114 is to partially recess the capacitor fill material. This recess is preferably done partially down the oversized capacitor opening, while leaving some capacitor fill material in the oversized capacitor opening. Turning to FIG. 6, the wafer portion 200 is illustrated after the polysilicon 508 has been partially recessed. This process leaves capacitor fill material in the capacitor trench and a portion of the fill material extending as a lip 602 over an adjacent portion of the wafer top surface. It should be noted that in the preferred embodiment, the bottom surface of lip 602 comes in direct contact with the top surface of wafer 200, and is not insulated from the top surface of the wafer. In the preferred embodiment, the lip extends between 1 nm and 200 nm over the surface of the wafer, and most preferably between 10 nm and 50 nm.

Figure 7:
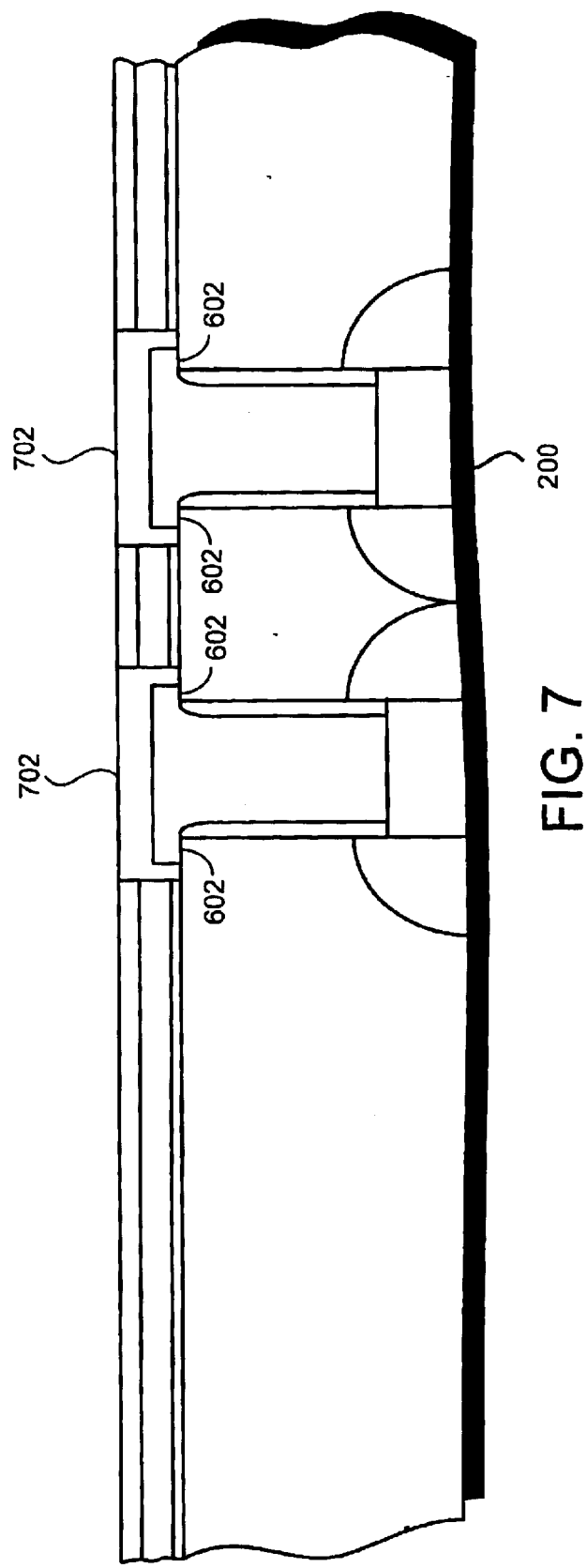

The next step 116 is to again fill the oversized capacitor opening with the an insulator material, such as silicon dioxide. This insulator material will be used to form a portion of the isolation structure between devices. Turning to FIG. 7, the wafer portion 200 is illustrated after the recessed gate structure opening has been filled with insulator material 702 and planarized.

Figure 8:
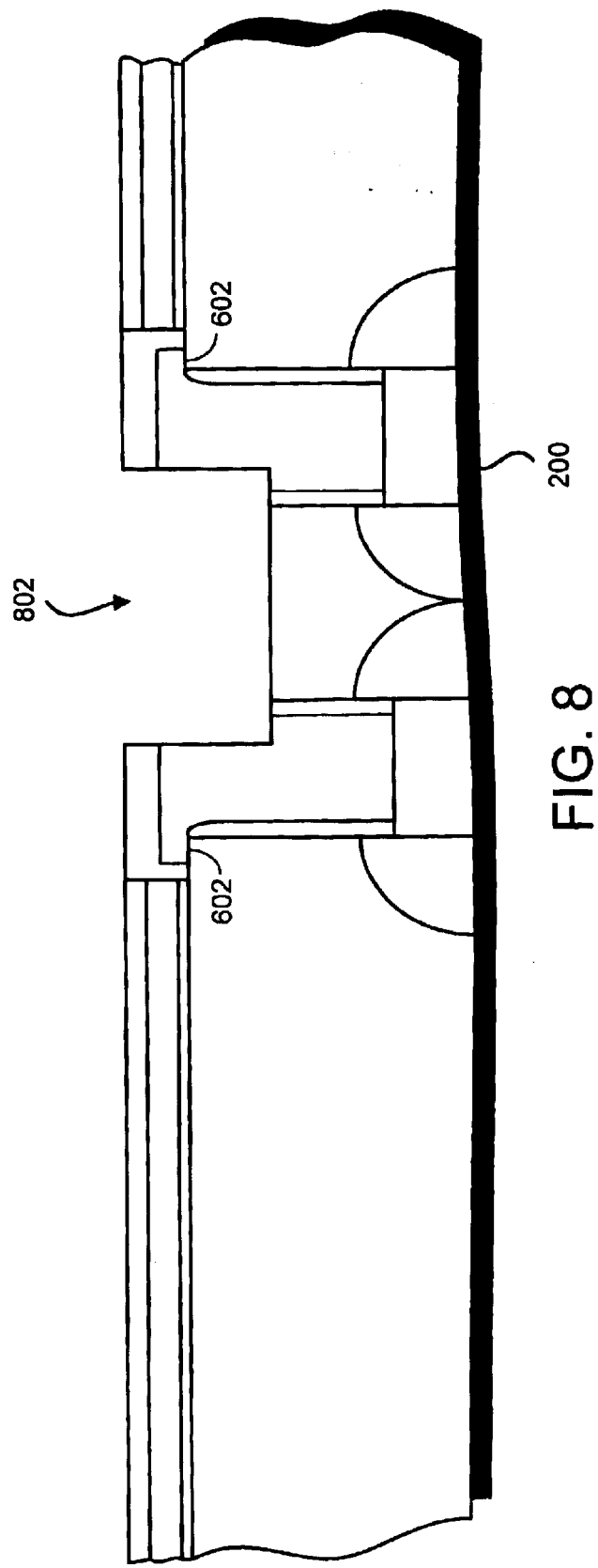
Figure 14:
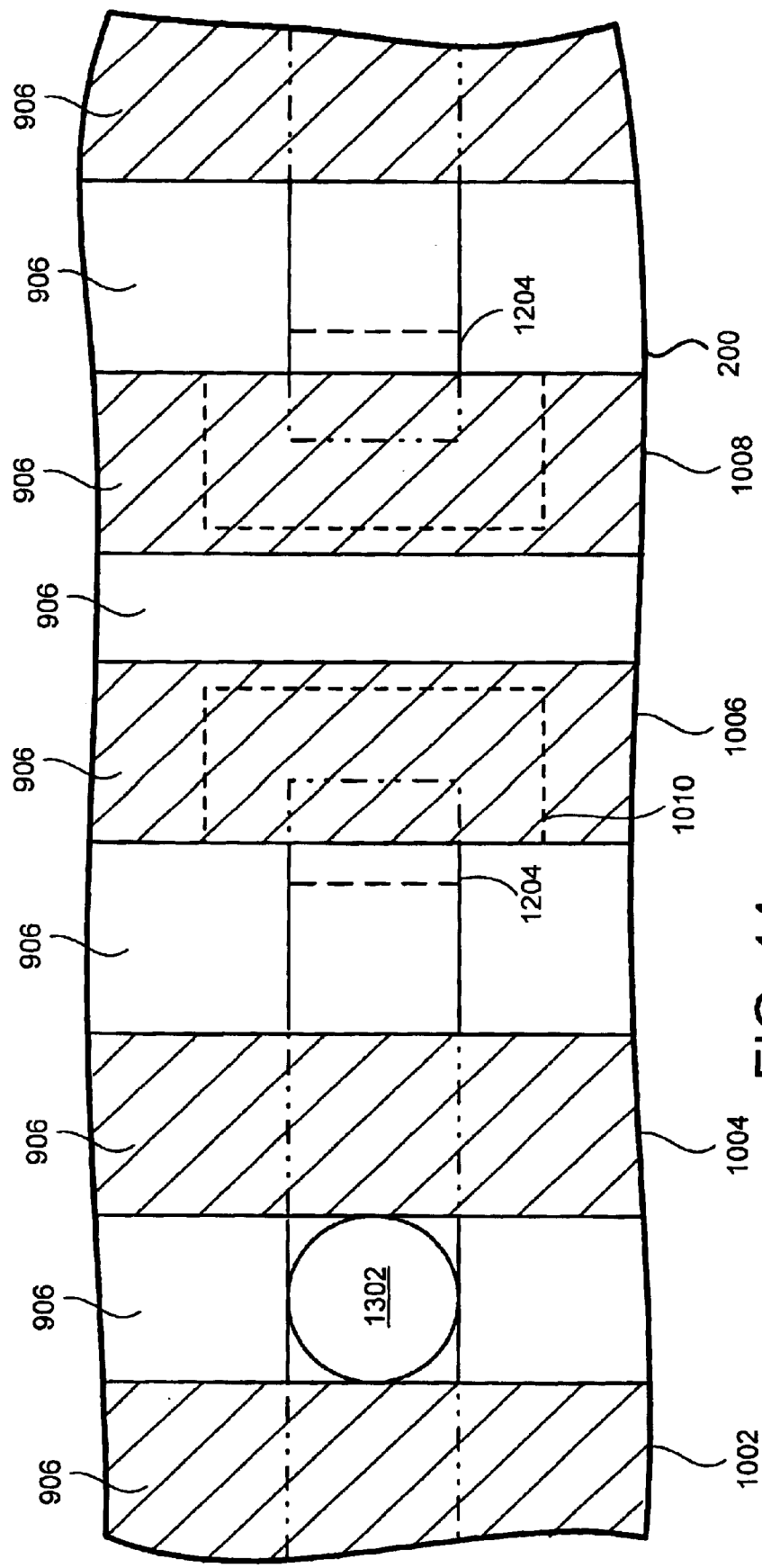
FIG. 14 depicts a top view of a portion of a wafer illustrating embodiments of the present invention.

The next step 118 is to etch isolation trenches. In the preferred embodiment, the isolation between cells is shallow trench isolation (STI). In shallow trench isolation, the STI mask defines the active area of the cell, as illustrated in FIG. 14. In the preferred embodiment, the step of etching the trenches for the STI removes the upper portion of the capacitor fill material, including the lips 602, except where the surface strap is to be formed. Turning now to FIG. 8, the wafer portion 200 is illustrated with an isolation trench 802 formed between adjacent memory cells. The formation of the isolation trench 802 has removed a portion of the capacitor fill material except where the surface strap is to be formed. It should be understood that as FIG. 8 is a cross section, only one "side" of the fill material top portion is shown as removed, but typically the fill material is also removed from the unseen sides of the capacitor by isolation trenches formed to between devices in the wordline direction. Thus, the capacitor fill material, including the lip 602, only remains on the side where the surface strap is to be formed.

The next step 120 is to fill the isolation trenches with insulator material such as silicon dioxide and planarize, removing the remaining material above the gate conductor.

In an alternative method, the isolation trenches are etched before the oversized capacitor openings are filled with insulator material (step 116). In this method, the capacitor fill material is partially recessed, the isolation trenches are then etched, and then both features are filled and planarized at the same time. This alternative method has the advantage of less processing steps, but the disadvantage of greater difficulty as a result of having to pattern the photoresist over an uneven surface when defining the isolation trench area lithographically. The remaining nitride layer 206 is then stripped prior to depositing the wordline material.

Figure 9:
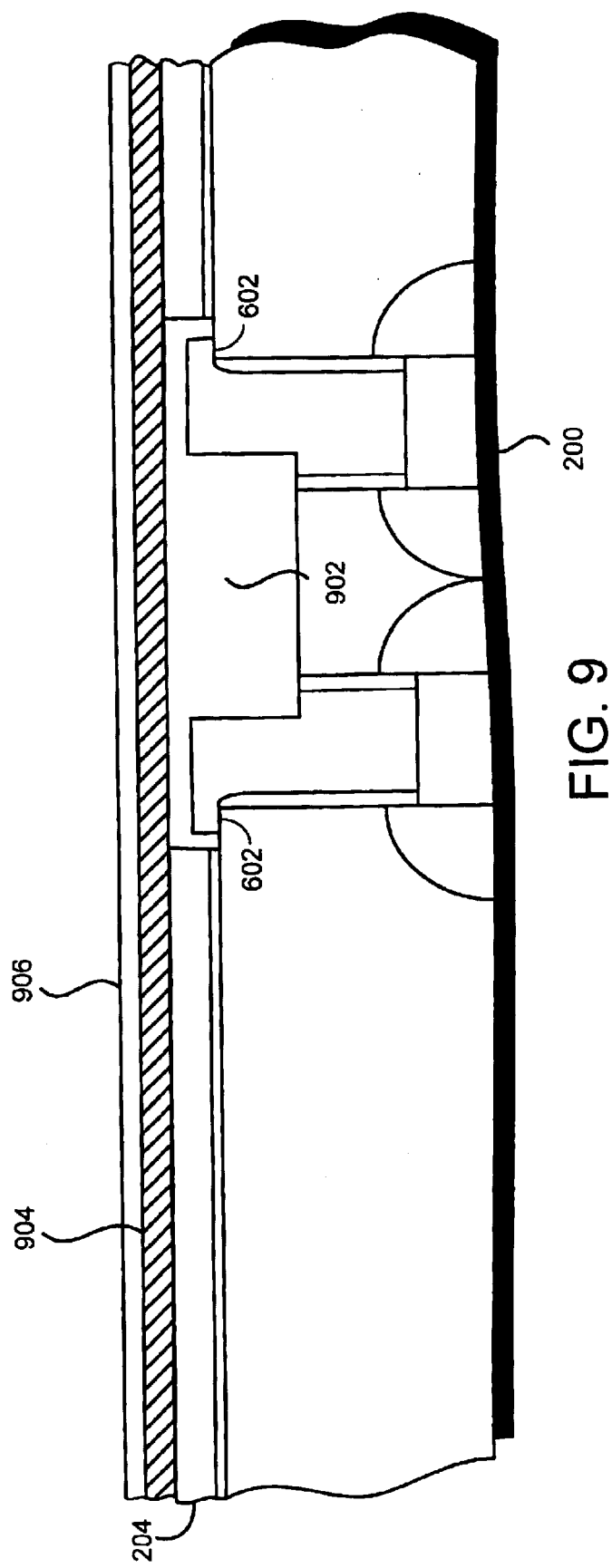

The next step 122 is to deposit wordline wiring material on the gate conductor, and covering the wordline material with a dielectric, such as silicon nitride. The wordline material can comprise any conductor, such as tungsten silicide, tungsten, etc. Turning to FIG. 9, the wafer portion 200 is illustrated with the isolation trenches 902 filled and planarized, wordline wiring material 904 deposited atop the isolation trenches and the remaining gate conductor material 204.

Figure 10:
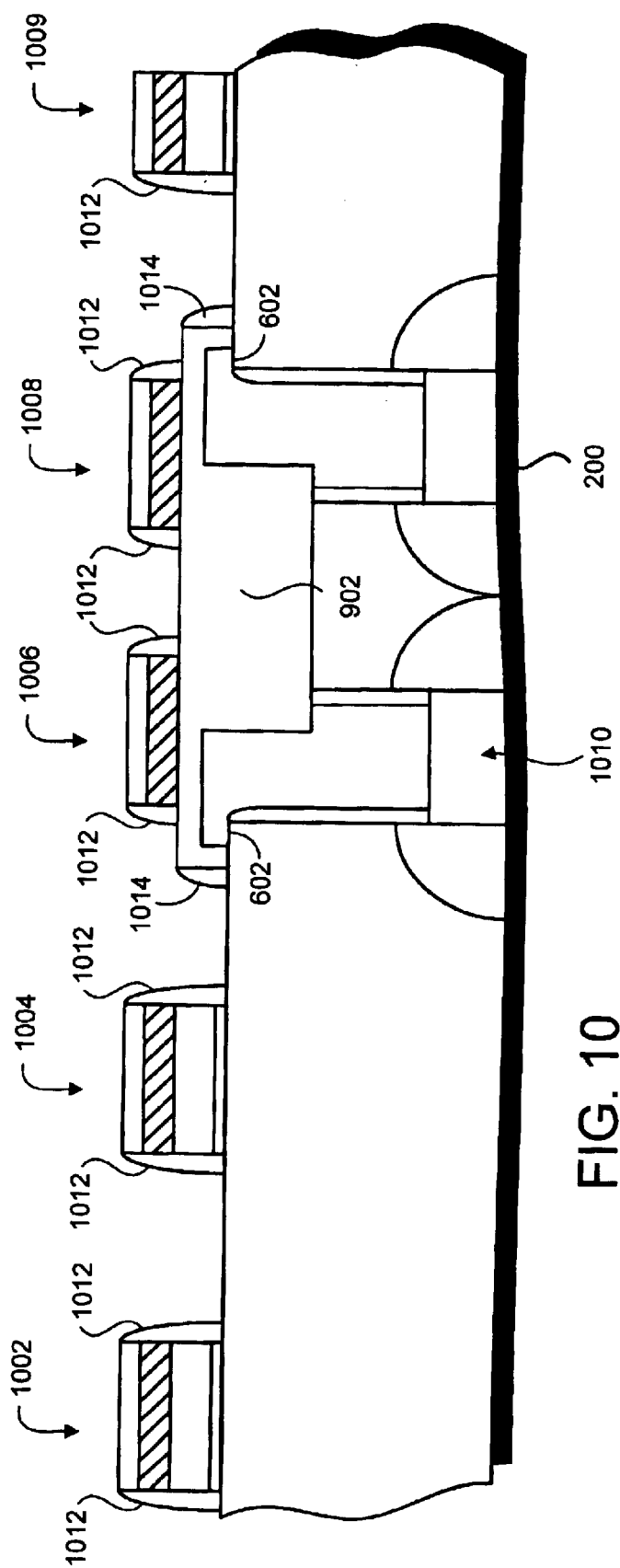

The next step 124 is to pattern the wordline/gates of the transfer devices. This is preferably done using an etch that is selective to the insulator material in the shallow trench isolation, typically silicon dioxide. Following that, sidewall spacers are formed on the exposed sidewalls. Turning now to FIG. 10, the wafer portion 200 is illustrated after the wordline/gates have been patterned using selective etching. This patterning creates the wordline/gates of the transfer devices. In FIG. 10, four wordline/gates are illustrated, wordline/gates 1002, 1004, 1006 and 1008. At this cross section wordline/gates 1006 and 1008 are the passing wordlines, meaning they do not connect to these devices, and instead connect to adjacent devices not shown. The passing wordline/gates 1006 and 1008 are isolated from the capacitors by shallow trench isolation 902. Wordline/gate 1004 is the transfer device gate for capacitor 1010, and wordline/gate 1002 is the transfer device gate for an adjacent capacitor not shown.

Because the preferred etch is selective to the STI material, the etch stops without substantially etching into the STI.

Sidewall spacers 1012 are formed on the sidewalls of the wordline/gates. These are formed by conformally depositing and directionally etching an insulator material, such as silicon nitride. This same process forms sidewall spacers 1014 at the sidewall of the shallow trench isolation edge. In the preferred embodiment, the sidewall spacers are formed to have a width of approximately 0.15F. Silicon nitride is the preferred spacer material because this facilitates the formation of borderless bitline contacts, as will be described in greater detail later. The etch process that defines the sidewall spacers 1014 also removes any remaining gate oxide from between the wordline/gates It should also be noted that in some cases it is desirable to form a shallower source/drain implant before formation of sidewall spacer 1012 to optimize the diffusion doping profile at the gate edge.

Figure 11:
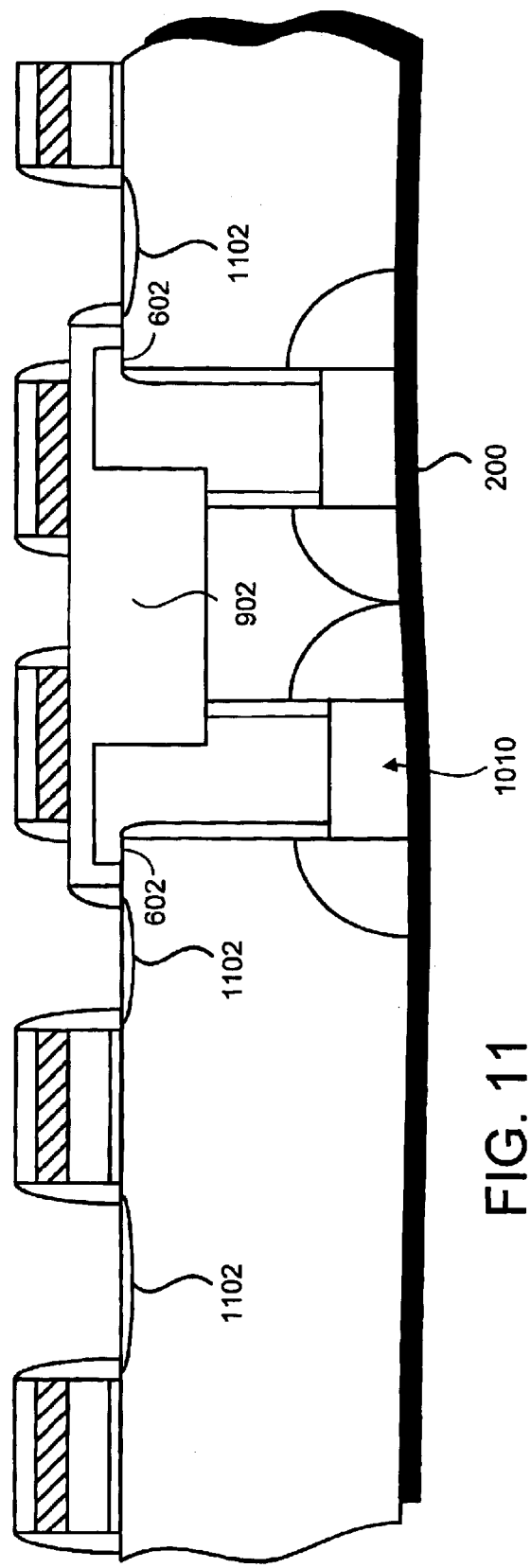

The next step 126 is to perform the source/drain implants. In this application, the term source/drain is used to genetically refer to either or both source and drain regions of the transfer device. These source/drain implants can be of any suitable dose and dopant type. Suitable dopants include phosphorous, arsenic, or boron for opposite polarity DRAM structure. Turning now to FIG. 11, wafer portion 200 is illustrated with the source/drain dopants 1102 implanted into the substrate between wordline/gates. After the implants 1102 have been made, the next step 128 is to activate the implants. This is preferably done using an appropriate annealing procedure to cause the implant dopants to diffuse to their correct depth. For example, by using a rapid thermal anneal at approximately 1000° C.–1100° C. for 10 to 30 seconds, or a furnace anneal at approximately 900° C. for 10 to 20 minutes.

In the preferred embodiment of the present invention, the step of activating the implants also forms the surface strap to connect the storage capacitor to the adjacent source/drain of the corresponding transfer device. In particular, dopants from the remaining lip of capacitor fill material diffuse into the underlying silicon substrate. Because these dopants are diffusing from above, their depth of diffusion is less than prior art buried straps which are formed by diffusing from their side. This results in less negative impact on short channel effects of the transfer device, and in particular, less resulting sub-threshold current.

Figure 12:
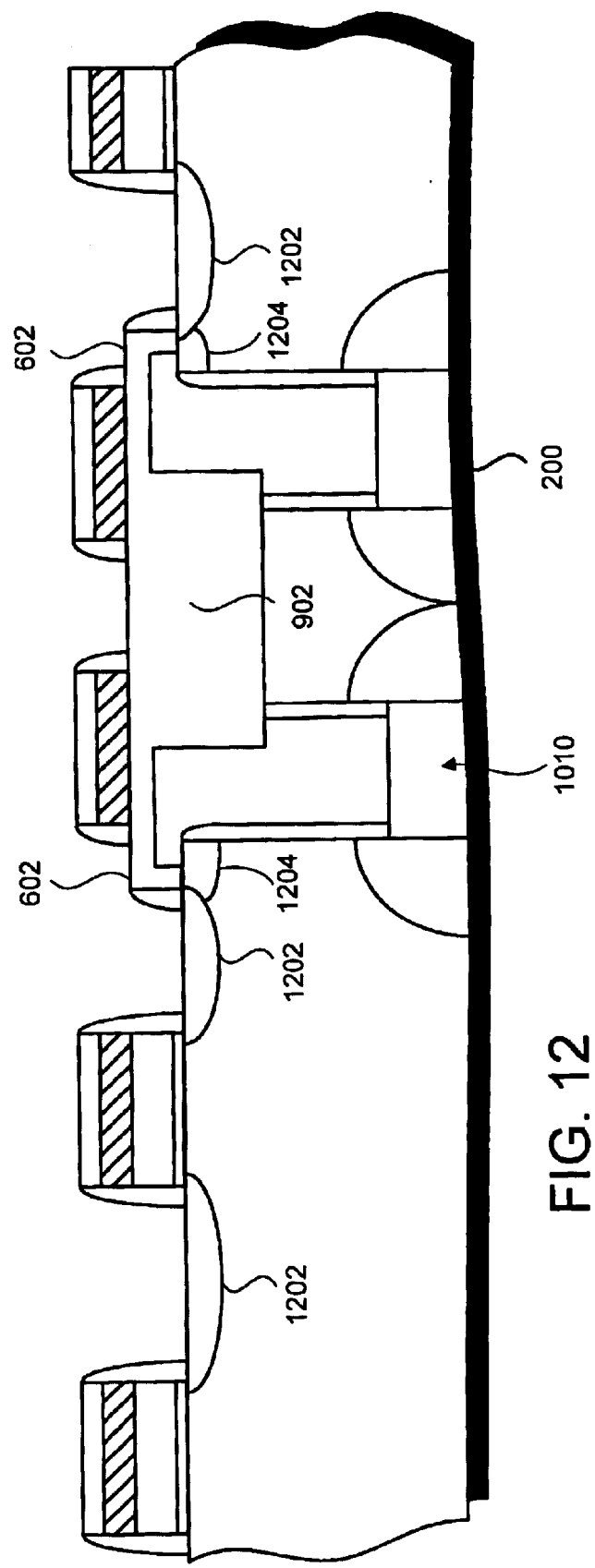

Turning now to FIG. 12, the wafer portion 200 is illustrated with after the source/drain implants have been activated, forming the source/drains 1202 of the transfer devices. As discussed above, in the preferred embodiment, this step also forms surface strap 1204 by diffusing dopants from the lip 602 of the trench capacitor. Because these dopants are diffusing from the lip 602, their depth of diffusion is less than prior art buried straps which are formed by diffusing from their side, resulting in better device performance.

It also should be emphasized that the preferred embodiment method for forming the surface strap described above results in a surface strap which has the advantage of being self-aligned with the deep trench capacitor, as compared to prior art straps which are not self-aligned.

Figure 13:
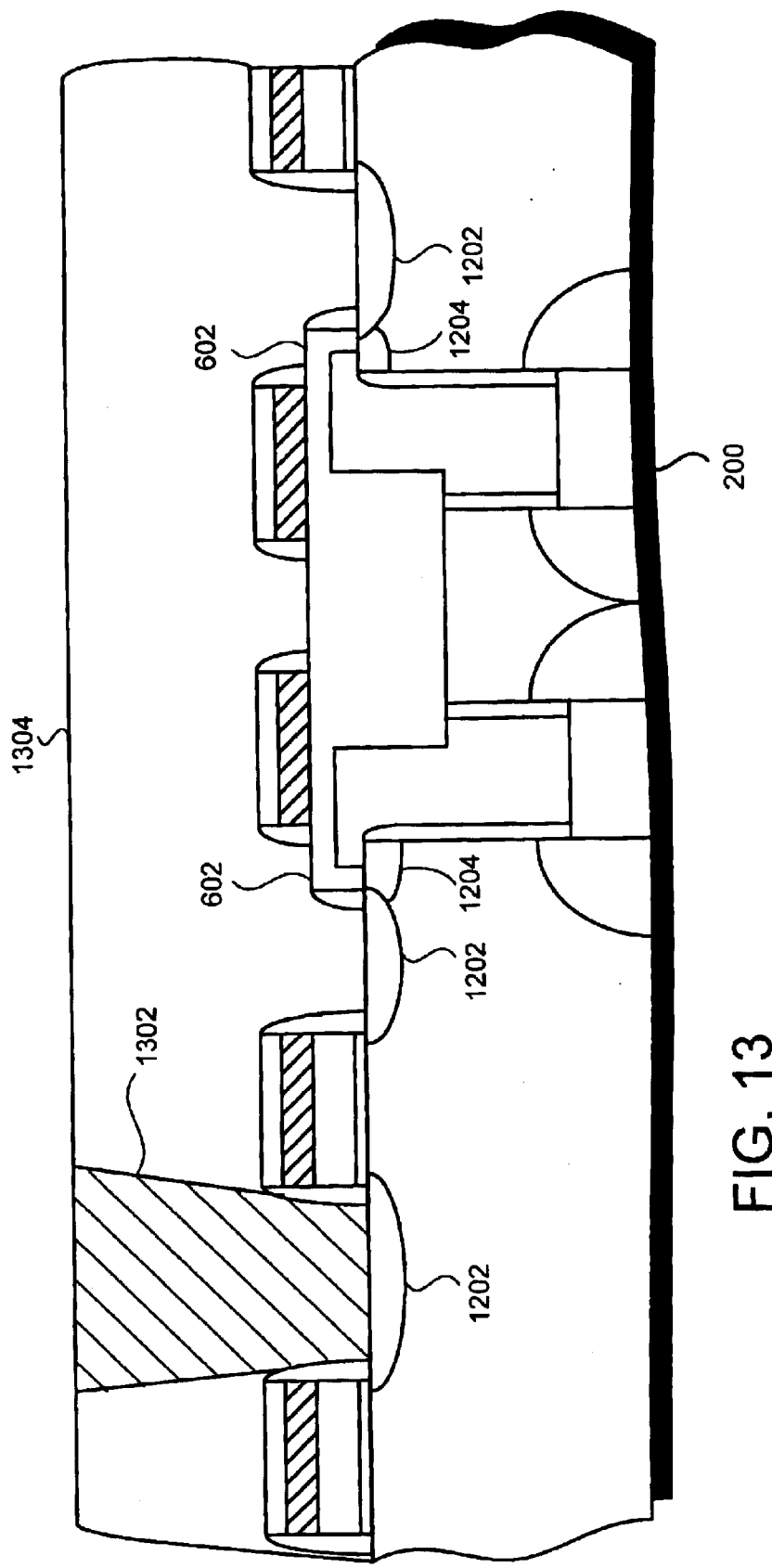

With the source/drains and surface straps created, the memory cells can be completed. Typically, this process involves the deposition and planarization of an insulation layer, such as silicon dioxide, and the creation of bitline contacts and the associated bitlines in the insulation layer, and other back-end-of-line processing. Turning to FIG. 13, the wafer portion 200 is illustrated with a bitline 1302 contact formed within a silicon dioxide layer 1304. The bitline contact 1302 attaches between the gates of two transfer devices borderless to the wordlines. In the illustrated embodiment, the memory cell is arranged using a folded bit line architecture, where adjacent memory cells share a bit line contact as illustrated.

Turning to FIG. 14, a top view of wafer portion 200 is illustrated, including the surface straps 1204, the trench capacitors 1010, the bitline contact 1302, the active wordlines 1002 and 1004, the passing wordlines 1006 and 1008. Also illustrated is the shallow trench isolation region 906, which defines the active area of the cell, and removes the lip 602 except where the surface strap is to be formed.

Turning now to FIGS. 15–18, a second embodiment of the present invention is illustrated. In this second embodiment, the formed surface strap is used as the transfer device source or drain. This embodiment has several advantages, including the advantage of achieving a relatively longer channel length while maintaining overall device density.

Figure 15:
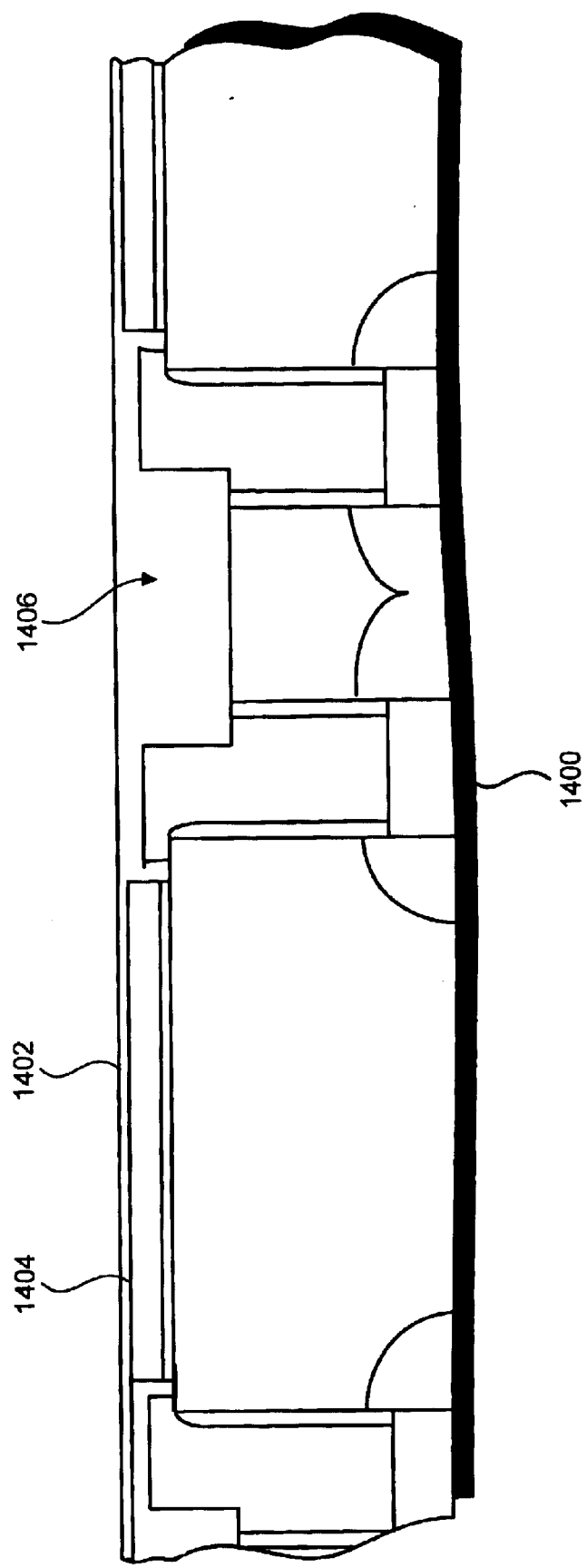
FIGS. 15–18 are schematic cross sections illustrating a second embodiment of the present invention.

In this second embodiment, when the STI insulator material is deposited and planarized away, a layer of insulator material is left to cover the gate conductor material. Turning to FIG. 15, a wafer portion 1400 is illustrated where an insulator material layer 1402 was left covering the gate conductor layer 1404. This insulator material layer 1402 could have been deposited after formation of the shallow trench isolation 1406, or deposited earlier.

Figure 16:
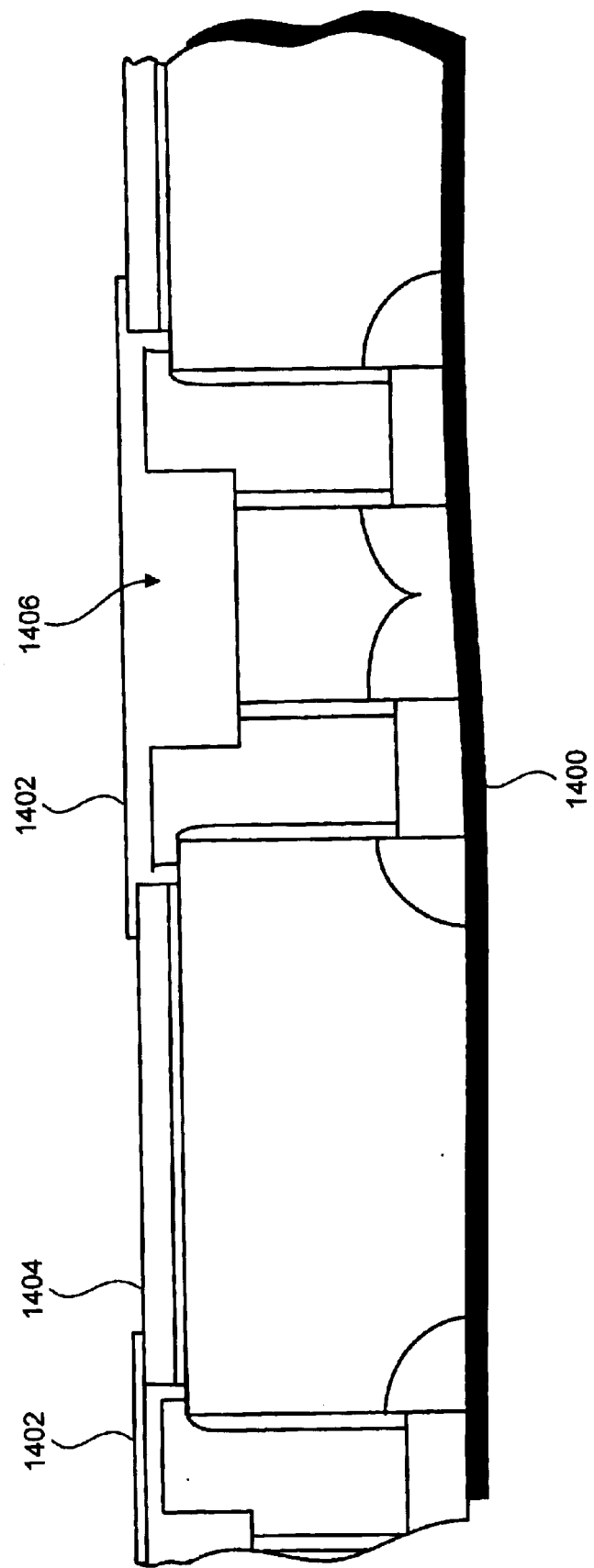

The next step in the second embodiment is to etch a portion of insulator material layer away. Preferably, the insulator material layer is removed over the regions where the wordline/gates and the bit line contacts are formed, while leaving enough insulator material to prevent etching of the underlying polysilicon during the gate patterning, as will be described later. The size of the removed insulating layer 1902 can be reduced to compensate for possible misalignment between masking steps. Turning now to FIG. 16, wafer portion 1400 is illustrated after a portion of the insulator layer 1402 has been etched away, exposing a portion of the gate conductor layer 1404.

Figure 17:
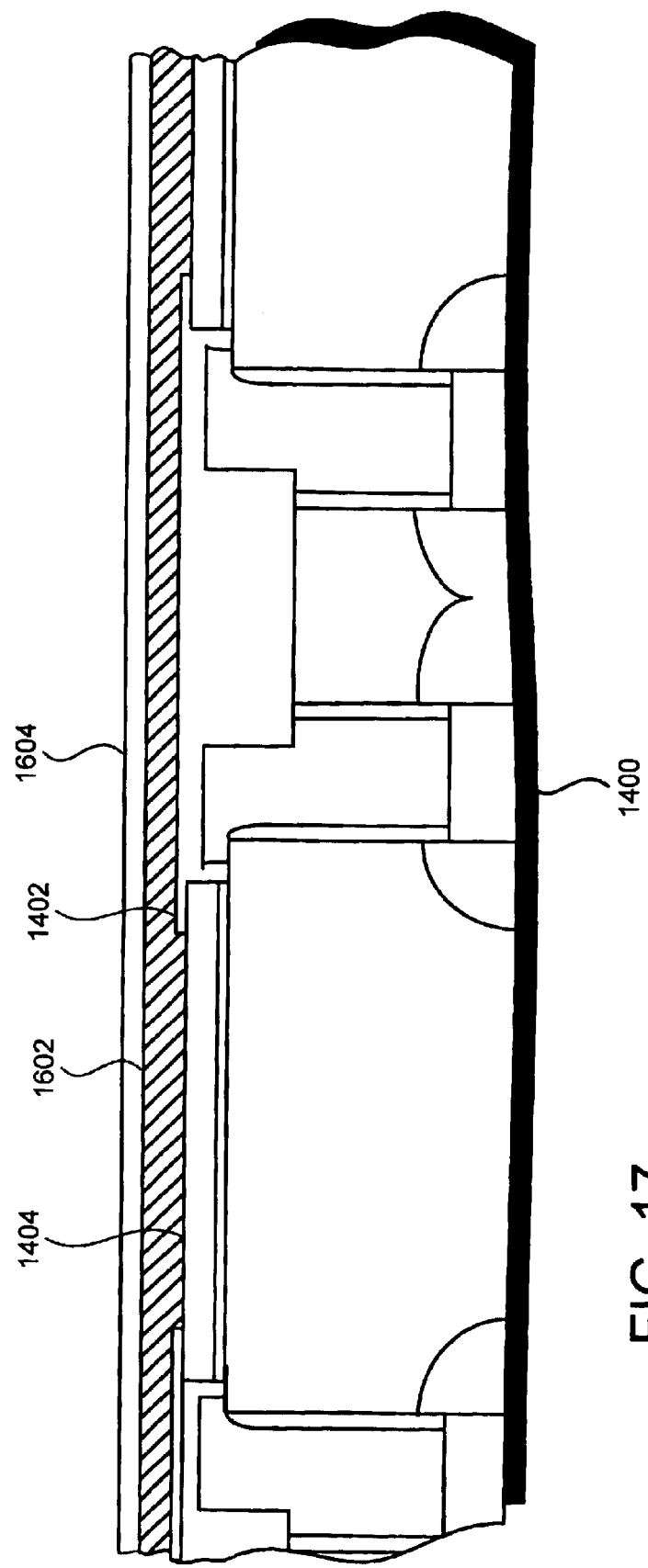

The next step in the second embodiment is to deposit a layer of wordline wiring material. This is comparable to step 122 discussed above. In this embodiment, the wordline material is isolated from underlying layers except where it contacts the underlying gate polysilicon through the openings etched above. On top of the wordline material another insulator layer, such as silicon nitride is deposited. Turning now to FIG. 17, the wafer portion 1400 is illustrated with wordline wiring material 1602 and insulator layer 1604 formed atop the wafer.

The next step is to pattern the wordline/gates of the transfer devices. This step is comparable to step 124 discussed with reference to first embodiment. Again; this etching is preferably done selective to the shallow trench isolation material and the remaining insulator material 1402 above the gate conductor material 1404. In particular, the remaining portions of insulator material 1402 that extend into the wordline/gates serve to prevent etching of the underlying polysilicon during patterning. This makes the gate polysilicon self aligned to surface strap of the preferred embodiment. In this embodiment the wordline/gates can be etched to provide a greater gate channel length. Following the patterning of the wordline/gates, fabrication can continue as in the first embodiment. The next major difference in this embodiment occurs when the source/drain implants are to be made. In the second embodiment, not all source/drain implants need to be made because the surface strap will be used to function as some of the source/drains. Thus, these source/drains will instead be created by diffusing from the capacitor fill material.

Figure 18:
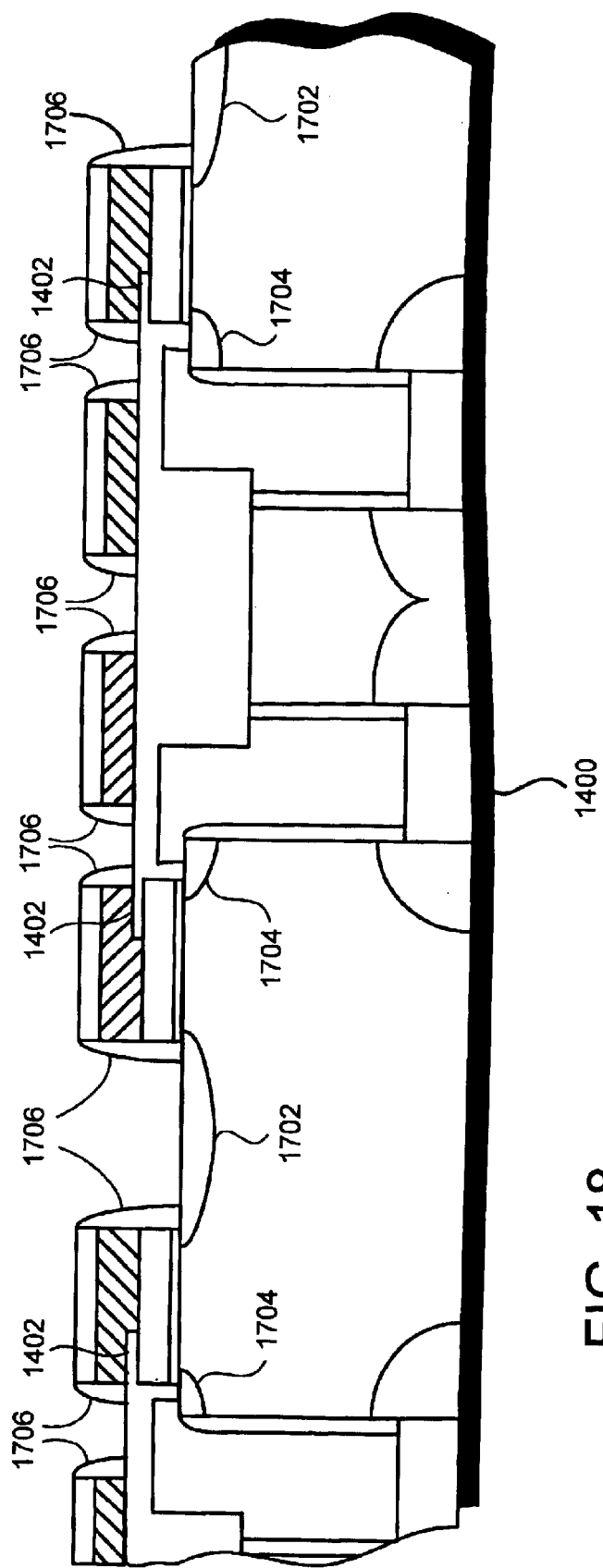

Turning now to FIG. 18, the wafer portion 1400 is illustrated after the source/drain implants have been made and activation performed. Thus, the wafer portion 1400 includes a traditional source/drain 1702 and surface strap 1704, which also functions as a source/drain. Again, the surface strap 1704 is preferably created during the activation step by dopant diffusing from the capacitor lip and into the underlying wafer substrate. The remaining portion of insulator material, herein illustrated as material 1402, serves to prevent etching of the underlying polysilicon during patterning and make the gate polysilicon self aligned to surface strap.

Thus, this second embodiment of the present invention combines the benefits of the first with the ability to further increase device channel length.

Figure 19:
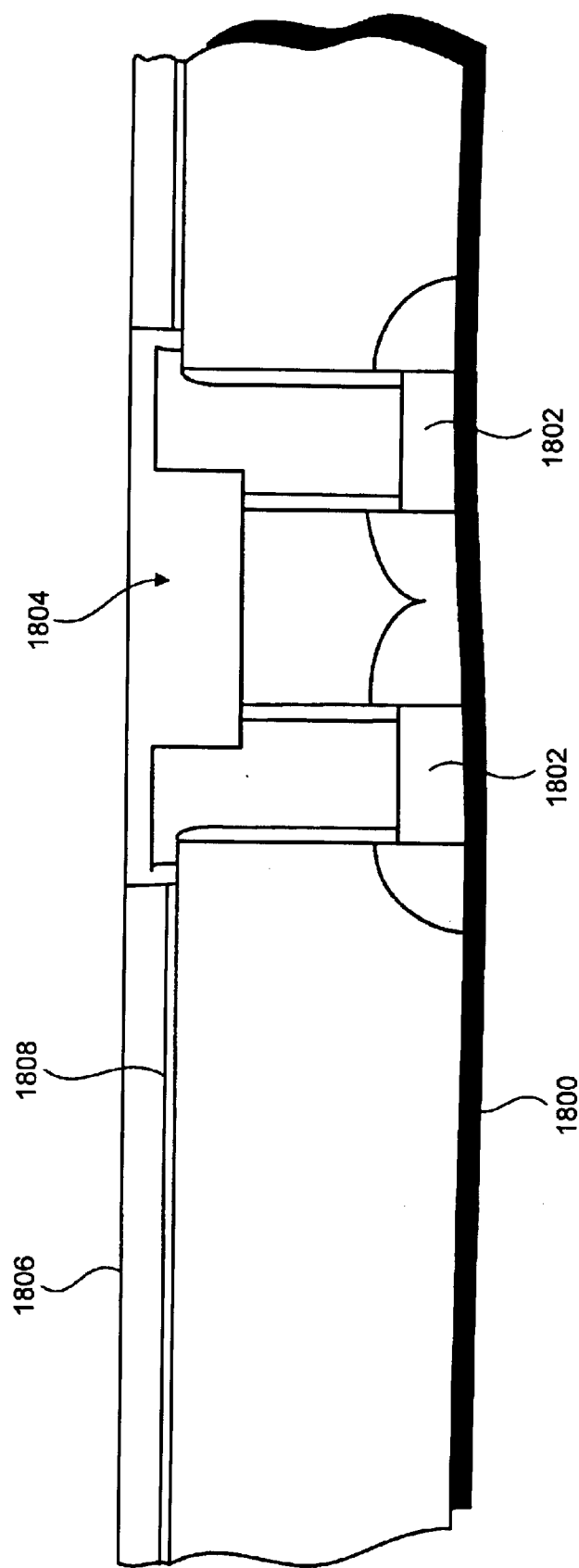
FIGS. 19–21 are schematic cross sections illustrating a third embodiment of the present invention.
Figure 20:
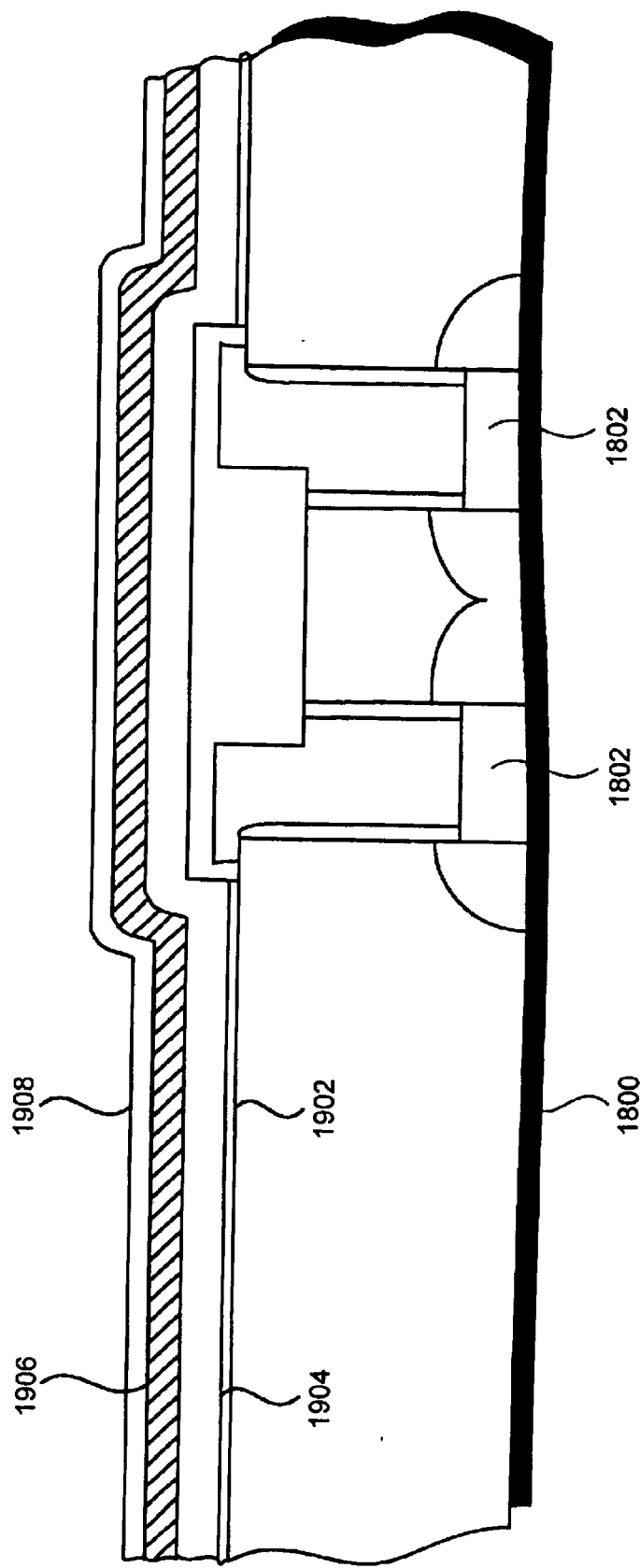
Figure 21:
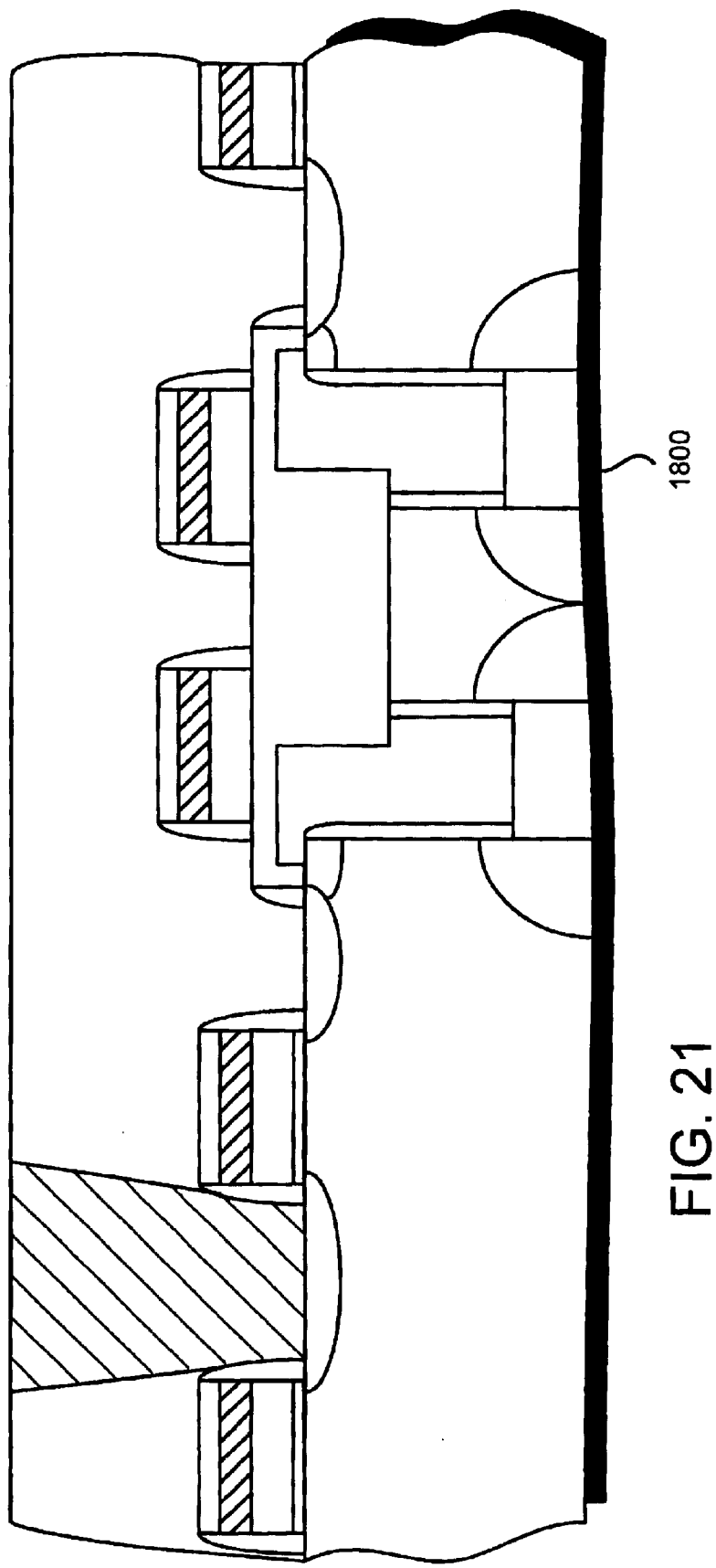
Figure 22:
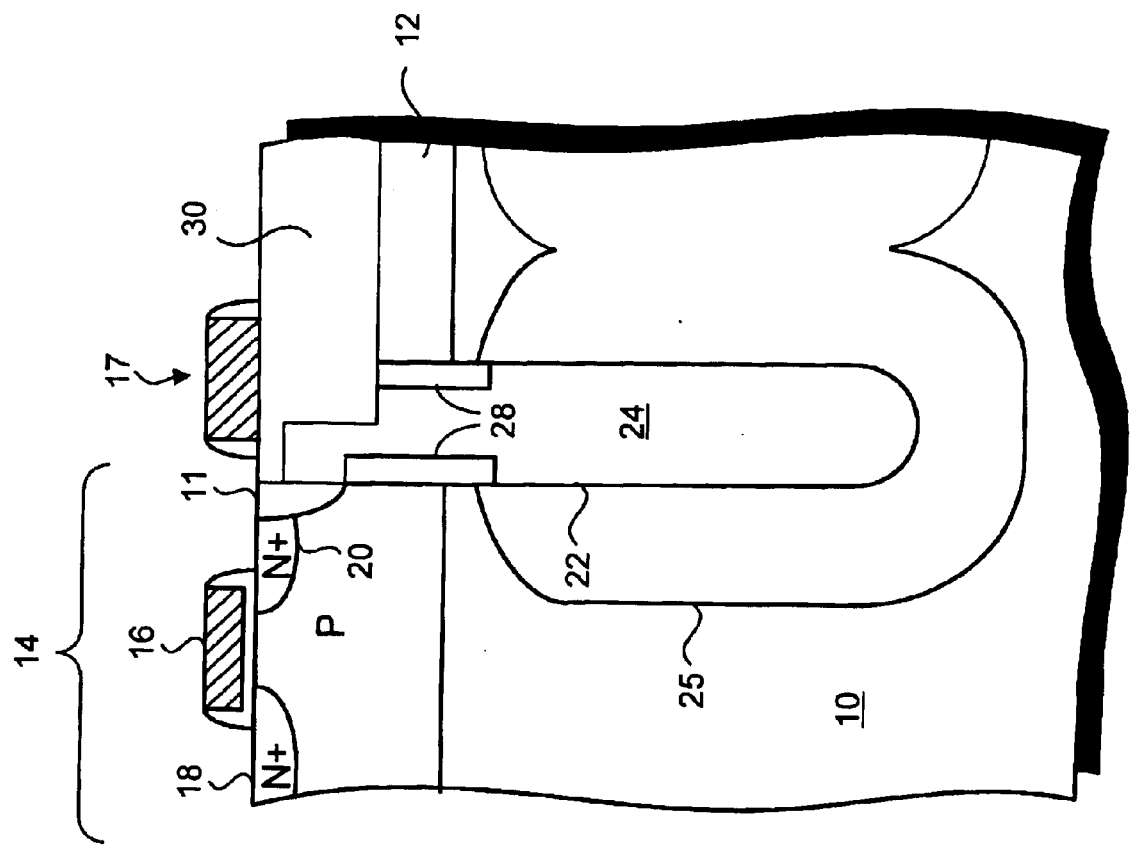
FIG. 22 illustrates a prior art DRAM cell.

Turning now to FIGS. 19–21, a third embodiment of the present invention is illustrated. This third embodiment has the advantage of being closer to conventional device processing, and thus fewer changes to fabrication technologies are needed to implement this embodiment.

In this embodiment the wafer is first prepared and pad oxide grown. Then a nitride layer is CVD deposited, followed by a oxide layer being CVD deposited. Preferably, these layers are approximately 200 nm and 700 nm thick respectively. The capacitor trenches are then formed substantially as formed in the first embodiment. This includes making openings in the nitride and oxide layers for each capacitor, with the openings being larger than the desired capacitor sizes by a predetermined amount. In particular, in the preferred embodiment, the trench capacitors openings are 1F by 2F, where F is the minimum feature size for the lithography system, and the oversize openings in the nitride and oxide layers are created to be approximately 1.5F by 2.5F.

Sidewall spacers are then formed on the sidewalls of the openings, and the capacitor trenches are then etched with the sidewall spacers and oxide layer serving as masks. The oxide layer and the sidewall spacers are then removed and the capacitors and shallow trench isolation formed as described with reference to the first embodiment. Turning now to FIG. 19, a wafer portion 1800 is illustrated after shallow trench isolation has been formed and the device planarized. The wafer portion includes trench capacitors 1802, STI region 1804, pad oxide 1808, and the remaining portion of nitride layer 1806.

The next step in the third embodiment is to strip the remaining nitride layer and the underlying pad oxide. A sacrificial oxide of approximately 5 nm is then grown. Well implants and device threshold tailoring implants are then made. The sacrificial oxide is then stripped while leaving the majority of the STI.

The next step is to form the gate stack. This involves first growing gate oxide. In the preferred embodiment, the gate oxide has a thickness of about 7 nm. Gate conductor and wordline wiring layers are then deposited. Again, the gate conductor preferably comprises approximately 100 nm of n$^+$ polysilicon, and the wordline wiring layer preferably comprises approximately 50 nm of tungsten silicide. Of course a single layer of a single material could also serve as the gate conductor and wordline wiring layer. A layer of nitride, preferably with a thickness of about 200 nm is then deposited on the wordline wiring layer. Turning now to FIG. 20, wafer portion 1800 is illustrated after the gate oxide 1902, gate conductor 1904, and wordline wiring layer 1906, and nitride layer 1908 have been deposited.

With gate stack formed, the next step is to pattern the stack to form wordline/gates and make the source/drain implants for the transfer devices. Nitride spacers are then formed (preferably having a width of approximately 0.1F) on the sidewalls of the wordline/gates and along the STI edges. The wafer portion is then annealed, causing the source/drain implants to become activated and causing dopants to diffuse from the lip of the storage capacitor into the substrate, forming the surface strap connection between the storage capacitor and the transfer device. After this is formed, the remaining processing is completed as described above. Turning now to FIG. 21, the completed devices are illustrated.

Thus, the preferred embodiment of the present invention provides unique structure for connecting between a storage capacitor and a transfer device in a memory cell and a method for fabricating the same. To form the connection, dopant is diffused from the lower surface of the capacitor step and into the substrate, forming a surface strap to connect between the storage capacitor and the transfer device. This surface strap has the advantage of being self aligned with the storage capacitor and the transfer device, facilitating higher memory cell densities.

While the invention has been particularly shown and described with reference to an exemplary embodiment process to form MINT DRAM cells, those skilled in the art will recognized that the preferred methods can be used to form other types of memory cells, and that various changes in form and details may be made therein without departing from the spirit and scope of the invention. For example, instead of NMOS transfer devices with n$^+$ polysilicon node conductors, PMOS transfer devices with p$^+$ polysilicon node conductors could be used. For example, instead of using separate gate conductor and wordline materials, a single layer of conductor material could be used. As another example, it will also be understood by those skilled in the art that the invention is applicable to different isolation technologies, well and substrate technologies, dopant types, energies and species. It will also be understood that the spirit of the invention is applicable to other silicon-based technologies (e.g., BiCMOS, bipolar, silicon on insulator (SOI), silicon germanium (SiGe).

What is claimed is:

1. A method for forming an interconnection between a storage capacitor and a transfer device in a memory cell, the method comprising the steps of:
   a) forming a capacitor having a lower portion and and upper portion, the upper portion of the capacitor including a lip and extending over a top surface of a substrate, the lower portion of the capacitor extending below the top surface of the substrate; and
   b) diffusing dopant from the lip above the substrate into the substrate through the top surface of the substrate, the diffusing dopant forming a surface strap in the substrate, the surface strap being below the lip and providing a connection between the capacitor and the transfer device.

2. The method of claim 1 wherein the step of forming a capacitor having a lip extending over a top surface of a substrate comprises:
   i) forming a first layer on the substrate;
   ii) etching an oversized capacitor opening in the first layer;
   iii) forming a sidewall spacer on sidewall of the oversized capacitor opening;
   iv) etching a trench in the substrate using the sidewall spacer as a mask;
   v) removing the sidewall spacer; and
   vi) filling the trench and oversized capacitor opening with capacitor fill material.

3. The method of claim 2 wherein the capacitor fill material comprises polysilicon.

4. The method of claim 2 wherein the step of forming a capacitor having a lip extending over a top surface of a substrate further comprises:
   vii) recessing the capacitor fill material partially into the oversized capacitor opening, and
   viii) filling the recess in the oversized capacitor opening with a dielectric material.

5. The method of claim 1 wherein the step of diffusing dopant from the lip into the top surface comprises annealing the substrate and the capacitor.

6. The method of claim 1 wherein the first layer comprises a gate stack including:
   i) a gate dielectric layer;
   ii) a gate conductor layer on the gate dielectric layer; and
   iii) an insulator layer on the gate conductor layer.

7. The method of claim 6 wherein the gate conductor layer comprises polysilicon.

8. The method of claim 6 wherein the insulator layer comprises a layer of silicon nitride and a layer of silicon dioxide.

9. The method of claim 1 wherein the first layer comprises a layer of silicon dioxide, a layer of silicon nitride, and an a layer of silicon dioxide.

10. The method of claim 1 wherein the step of forming a capacitor comprises the steps of:
   i) forming a gate stack, the gate stack including a gate dielectric, a gate conductor on the gate dielectric, and an insulator layer on the gate conductor;
   ii) etching an oversized capacitor opening in the gate stack;
   iii) forming a sidewall spacer on sidewall of the oversized capacitor opening;
   iv) etching a trench in the substrate using the sidewall spacer and the insulator layer on the gate conductor as a mask;
   v) removing the sidewall spacer;
   vi) forming an oxide collar in the trench;
   vii) filling the trench and oversized capacitor opening with a capacitor fill material thereby forming a lip of capacitor fill material at the top of the trench;
   viii) recessing the capacitor fill material partially into the oversized capacitor opening;
   ix) filling the recess in the oversized capacitor opening with a dielectric material; and
   x) forming shallow trench isolation, the shallow trench isolation removing portions of the lip except where a connection from the capacitor to the transfer device is to be formed.

11. The method of claim 10 further comprising the steps of:
   d) patterning the remaining gate conductor stack; and
   c) forming sidewall spacers on the sidewalls of the patterned gate conductor stack.

12. The method of claim 1 wherein the step of forming a capacitor comprises the steps of:
   i) forming a gate stack, the gate stack including a gate dielectric, a gate conductor on the gate dielectric, and an insulator layer on the gate conductor;
   ii) etching an oversized capacitor opening in the gate stack;
   iii) forming a sidewall spacer on sidewall of the oversized capacitor opening; iv) etching a trench in the substrate using the sidewall spacer and the insulator layer on the gate conductor as a mask;
   v) removing the sidewall spacer;
   vi) forming an oxide collar in the trench;
   vii) filling the trench and oversized capacitor opening with a capacitor fill material thereby forming a lip of capacitor fill material at the top of the trench;
   viii) recessing the capacitor fill material partially into the oversized capacitor opening;
   ix) filling the recess in the oversized capacitor opening with a dielectric material;
   x) forming shallow trench isolation, the shallow trench isolation removing portions of the gate stack and portions of the capacitor lip except where a connection from the capacitor to the transfer device is to be formed;
   xi) planarizing shallow trench isolation and the remaining gate stack, such that a portion of the insulator layer remains on the gate conductor layer;
   xii) removing a portion of the remaining insulator layer between shallow trench isolation regions, the removal exposing portions of the underlying gate conductor material;
   xiii) deposing wordline line material that contacts the exposed gate conductor material;
   xiv) patterning the wordline and gate conductor material to form a plurality of gates;
   xv) forming a source/drain implants; and
wherein the step of diffusing dopant from the lip into the top surface of the substrate comprises annealing, and wherein the dopant diffused from the lip to the top surface comprises a source/drain of the transfer device and wherein in source/drain implant diffuses to form a source/drain of the transfer device.

13. The method of claim 12 wherein the step of patterning the wordline and gate conductor material comprises etching selective to the remaining insulator material to avoid etching the gate conductor material at portions adjacent to the capacitor.

14. The method of claim 12 wherein the step of removing a portion of the remaining insulator layer between shallow trench isolation regions comprises leaving a portion extending into area where the gate will be formed to compensate for potential alignment errors.

15. The method of claim 1 wherein the step of forming a capacitor comprises the steps of:
   i) forming a first layer on the substrate, the first layer comprising a first silicon dioxide layer, a silicon nitride layer and second silicon dioxide layer;
   ii) etching an oversized capacitor opening in the first layer;
   iii) forming a sidewall spacer on sidewall of the oversized capacitor opening;
   iv) etching a trench in the substrate using the sidewall spacer and the first layer as a mask;
   v) removing the sidewall spacer;
   vi) forming an oxide collar in the trench;
   vii) filling the trench and oversized capacitor opening with a capacitor fill material thereby forming a lip of capacitor fill material at the top of the trench;
   viii) recessing the capacitor fill material partially into the oversized capacitor opening;
   ix) filling the recess in the oversized capacitor opening with a dielectric material;
   x) forming shallow trench isolation, the shallow trench isolation removing portions of the lip except where a connection from the capacitor to the transfer device is to be formed.

16. The method of claim 12 further comprising the steps of:
   c) removing remaining portions of the first layer;
   d) forming gate dielectric;
   e) depositing a gate conductor material;
   f) patterning the gate conductor.

17. A method for forming a connection between a capacitor and a transfer device on a semiconductor substrate having a top surface, the method comprising the steps of:

a) forming a first layer on the substrate;

b) etching an oversized capacitor opening in the first layer;

c) forming a sidewall spacer on sidewalls of the oversized capacitor opening;

d) etching a capacitor trench in the semiconductor substrate using said sidewall spacer and said first layer as a mask, said capacitor trench having a top edge at the top surface of said semiconductor substrate;

e) depositing capacitor fill material in said capacitor trench, said capacitor fill material extending over said capacitor trench top edge to form a lip of capacitor fill material on said top surface of said semiconductor substrate; and f) diffusing dopants from said capacitor fill material through said top surface of said semiconductor substrate into said semiconductor substrate from said lip of capacitor fill material above said semiconductor substrate, the diffusing dopant forming a surface strap in the substrate, the surface strap being below the lip and providing a connection between the capacitor and the transfer device.

18. The method of claim 17 wherein the first layer comprises a gate dielectric layer, a gate conductor layer and a insulator layer.

19. The method of claim 17 wherein the first layer comprises a first silicon dioxide layer, a silicon nitride layer and second silicon dioxide layer.

20. The method of claim 17 wherein the step of depositing capacitor fill material comprises performing a first deposition of capacitor fill material, recessing said first deposition of capacitor fill material, said recess partially exposing sidewalk of said capacitor trench, forming sidewall spacers on said exposed sidewalk of said capacitor trench, and refilling the capacitor trench and oversized capacitor opening.

21. The method of claim 17 wherein the capacitor fill material comprises n+ doped polysilicon.

22. The method of claim 17 wherein the step of diffusing dopants from said capacitor fill material into said semiconductor substrate from said lip of capacitor fill material comprises annealing the semiconductor substrate.

23. The method of claim 17 further comprising the step of etching an isolation trench, wherein said etching of said isolation trench removes a portion on said lip of capacitor fill material except where a connection between said capacitor and said transfer device is to be made.

24. The method of claim 23 further comprising the step of filling said isolation trench with isolation material and planarizing said isolation material.

25. The method of claim 24 wherein the first layer comprises a gate dielectric layer, a gate conductor layer and a insulator layer and wherein the step of planarizing said isolation material removes said insulator layer to expose said gate conductor material.

26. The method of claim 24 wherein the first layer comprises a gate dielectric layer, a gate conductor layer and a insulator layer and wherein the step of planarizing said isolation material leaves a portion of the insulator layer covering the gate conductor layer.

27. The method of claim 25 further comprising the step of depositing a wordline material layer on said gate conductor material and said isolation material, and further comprising the step of patterning the gate conductor material and wordline material to form a plurality of transfer device gates.

28. The method of claim 26 further comprising the steps of etching an opening in the remaining portion of the insulator layer to expose a portion of the gate conductor layer and depositing a wordline material layer on the exposed gate conductor material, the remaining insulator layer and the isolation material, and further comprising the step of patterning the gate conductor material and wordline material to form a plurality of transfer device gates, wherein the remaining insulator layer serves as an etch block to prevent unwanted etching of the gate conductor material.

29. The method of claim 24 wherein the first layer comprises a first silicon dioxide layer, a silicon nitride layer and second silicon dioxide layer wherein the step of planarizing said isolation material removes any remaining portion of said second silicon dioxide layer and planarizes said silicon nitride layer, and further comprising the step of removing said silicon nitride layer and forming a gate dielectric layer, a gate conductor layer, and a wordline material layer, and further comprising the step of patterning said gate dielectric layer, said gate conductor layer and said wordline material layer to define a gate of the transfer device.

* * * * *